(12) United States Patent
Aoki et al.

(10) Patent No.: US 6,998,352 B2
(45) Date of Patent: Feb. 14, 2006

(54) CLEANING METHOD, METHOD FOR FABRICATING SEMICONDUCTOR DEVICE AND CLEANING SOLUTION

(75) Inventors: Hidemitsu Aoki, Tokyo (JP); Hiroaki Tomimori, Tokyo (JP); Kenichi Yamamoto, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 252 days.

(21) Appl. No.: 10/284,191

(22) Filed: Oct. 31, 2002

(65) Prior Publication Data
US 2003/0087524 A1 May 8, 2003

(30) Foreign Application Priority Data
Nov. 2, 2001 (JP) .............................. 2001-338017

(51) Int. Cl.
*H01L 21/302* (2006.01)
(52) U.S. Cl. .................. 438/745; 438/754; 438/756
(58) Field of Classification Search ................ 438/745, 438/754, 756, 692; 134/3, 28, 29; 510/175, 510/176
See application file for complete search history.

(56) References Cited

U.S. PATENT DOCUMENTS

| 3,907,699 | A  | * | 9/1975  | Blair ........................... 510/263 |
| 6,156,661 | A  | * | 12/2000 | Small .......................... 438/692 |
| 6,387,190 | B1 | * | 5/2002  | Aoki et al. .................... 134/28 |
| 6,399,552 | B1 | * | 6/2002  | Lee et al. .................... 510/175 |
| 6,423,148 | B1 | * | 7/2002  | Aoki ............................ 134/3 |

FOREIGN PATENT DOCUMENTS

| JP | 10-041262   | 2/1998 |
| JP | 11-162917   | 6/1999 |
| JP | 2000-12494  | 1/2000 |
| JP | 2002-69495  | 3/2002 |

* cited by examiner

*Primary Examiner*—Kin-Chan Chen
(74) *Attorney, Agent, or Firm*—Young & Thompson

(57) ABSTRACT

A cleaning solution having an oxidation-reduction potential lower than that of pure water and a pH value of 4 or below is used to remove metal contamination, thereby efficiently removing the metal contamination adhered onto a surface of a substrate without damaging an underlayer.

24 Claims, 8 Drawing Sheets

CLEANING METHOD, METHOD FOR FABRICATING SEMICONDUCTOR DEVICE AND CLEANING SOLUTION

BACKGROUND OF THE INVENTION

1. Field of the Invention

The present invention relates to a cleaning technique employed in a process of fabricating a semiconductor device, in particular, to a substrate cleaning technique for cleaning a substrate having a surface on which a metal material is exposed.

2. Description of the Related Art

Recently, in view of a higher operation speed of logic devices, a copper wiring having low resistance, excellent in resistance against electromigration, has been widely used. Since the copper is hard to process by dry etching, a wiring pattern is formed by a Damascene process utilizing CMP (Chemical Mechanical Polishing) in the case where a copper wiring is to be formed. However, since the CMP is a process for polishing a copper film with polishing particles, a large amount of particles or metal contamination are adhered to a surface of a wafer as the result of CMP. Therefore, it is important to thoroughly clean the surface of the wafer after completion of CMP.

A cleaning process after CMP is normally conducted according to the process as shown in FIG. 1. Specifically, after conducting a CMP (Chemical Mechanical Polishing) process on a substrate having a Cu-exposed portion (hereinafter, this process is abbreviated as "Cu-CMP") (Step S101), cleaning for removing particles is first conducted (Step S102). This cleaning is normally conducted by brush scrub cleaning using an alkaline cleaning solution. Subsequently, cleaning for removing metal contamination is conducted (Step S103). This second cleaning is conducted with an organic acid cleaning solution including, for example, oxalic acid or citric acid. Then, after rinsing a wafer with pure water (Step S104), the substrate is dried to complete the cleaning process (Step S105).

The above-described process will be further described with reference to cross-sectional views showing the respective steps. FIG. 2A to FIG. 2D are cross-sectional views showing the substrate while the process in FIG. 1 is being conducted. First, as shown in FIG. 2A, a wiring groove is formed on a surface of an insulating film 101. Then, a barrier metal film 102 and a copper film 103 are sequentially formed on the insulating film 101.

Subsequently, as shown in FIG. 2B, the copper film 103 is polished by CMP so as to leave the copper film 103 only in the wiring groove. After completion of CMP, a large amount of particles 104 and metal contamination 105 are adhered onto the surface of the substrate.

Next, as shown in FIG. 2C, brush scrub cleaning is first conducted by using an alkaline cleaning solution so as to remove these particles. As a result, the particles 104 are removed.

Subsequently, as shown in FIG. 2D, the metal contamination 105 is removed by oxalic acid, citric acid or the like. At this moment, however, slits 110 are sometimes generated between the barrier metal film 102 and the copper film 103. Although a generation mechanism of the slits 110 is not completely elucidated, it is believed that these slits are generated due to a kind of battery effect. In the case where such slits are generated, there arises a problem in that the degradation in reliability (resistance against electromigration or the like) of the copper wiring is induced. In addition, when a film is to be formed in the wiring layer, the flatness of the film is lost. It is difficult to completely prevent the generation of such slits even if an anticorrosive is added to an organic acid cleaning solution.

The slits may be generated in a similar manner in a process of forming a through hole on the copper wiring. FIG. 3 shows a state where the slits are generated when a through hole is formed by dry etching after formation of an interlayer insulating film on the copper wiring. A copper wiring having a structure including a laminate of the barrier metal film 102 and the copper film 103 is provided in the wiring groove formed on the insulating film 101. Then, a diffusion barrier film 107 and an interlayer insulating film 108 are formed thereon. A through hole 109 reaching the copper wiring is formed by dry etching. After formation of the through hole 109, a process for removing a resist film or a process for cleaning the inside of the through hole are conducted. In these processes, the slits 110 are generated due to the action of a resist stripping solution or the like. With the increased fineness of an element in these days, a socalled borderless wiring has been widely utilized. The borderless wiring has a wiring width equal to a through hole diameter. In the case where such a structure is employed, even with slight misalignment of a mask, a boundary face between the barrier metal film 102 and the copper film 103 is exposed, increasing the possibility of generating the above-described slits.

In each of the above-described processes, not only the generation of the slits, but also an increase in resistance due to increased roughness of the surface of the copper film and a drop in resistance against electromigration become problems in some cases. These problems arise because an oxide film present on the surface of the copper film is dissolved in acid to generate minute concave and convex portions on the surface of the copper film.

The problems of the generation of the slits inherent to the use of a cleaning solution or a stripping solution have been described above. The problem induced by using the cleaning solution is not limited to the generation of the slits; conventional cleaning also involves a problem of damaging an underlayer. FIG. 4 shows a state after formation of a contact hole reaching source/drain regions 122 of a transistor. In this case, a field-effect transistor 121 is provided on a silicon substrate 120. On both sides of the field effect transistor 120, source/drain regions 122 are respectively formed. An interlayer insulating film 123 is formed on the thus constituted transistor. A contact hole 125 reaching the source/drain regions 122 is provided through the interlayer insulating film 123. In a process for providing the contact hole 125, metal contamination 124 is adhered to an inner wall of the contact hole 125. This metal contamination 124 is generated during dry etching, and is brought to be adhered onto the inner wall of the contact hole. In order to remove the metal contamination 124, cleaning with a mixed solution of hydrogen peroxide and acid has been conventionally conducted. If such cleaning is performed, however, an oxide film is formed on a bottom face of the contact hole, which sometimes leads to an increase in resistance. It is possible to conduct the cleaning using a hydrofluoric acid cleaning solution instead of the above mixed solution. In such a case, however, side etching on sidewalls of the contact hole proceeds. As a result, a desired hole shape cannot be obtained in some cases. As described above, if acid cleaning for removing the metal contamination is conducted in the semiconductor device fabrication process, there arise various problems such as the generation of slits in the metal film or the damages to the underlayer.

As a technique for removing the contamination comprising a metal and a metal oxide/hydroxide without damaging the metal wiring, Japanese Patent Laid-Open Publication No. Hei. 10-41262 discloses a cleaning method using a neutral or acid cleaning solution whose oxidation-reduction potential is controlled by dissolving a hydrogen gas or the like therein. However, this conventional technique relates to a technique for removing contamination comprising iron or its oxide/hydroxide. This technique provides a cleaning method using a neutral or acid cleaning solution instead of a conventionally used strong acid cleaning solution so as not to damage a metal wiring when the contamination is to be removed. More specifically, as cleaning solutions, water containing dissolved hydrogen, which has an oxidation-reduction potential (with respect to a normal hydrogen electrode) of −300 to −400 mV and pH7, or an aqueous solution having pH 5.5, which is obtained by bubbling hydrogen in a carbon dioxide aqueous solution to be dissolved and the like are disclosed. However, although these cleaning solutions are effective for removing the metal contamination of specific metals such as iron metals, it is difficult to remove metal contamination of hardly removable metals such as copper, or particles containing the same metal as the metal film on which the particles are adhered. Moreover, in the method of bubbling and dissolving hydrogen in a carbon dioxide aqueous solution, a sufficient amount of hydrogen is not dissolved, so that the oxidation-reduction potential becomes relatively high. As a result, this method is not necessarily effective to deal with the problems such as the generation of slits or the surface roughness in a copper wiring formation process.

SUMMARY OF THE INVENTION

An object of the present invention is to provide a cleaning technique for efficiently removing metal contamination adhered onto a surface of a substrate without damaging an underlayer.

Another object of the present invention is to provide a cleaning technique for allowing efficient removal of metal contamination adhered onto surfaces of a copper wiring and an insulating film without generating slits at the boundary between the copper wiring and a barrier metal film and damaging the surface of the copper wiring in a copper wiring formation process.

A further object of the present invention is to provide a technique allowing the removal of a mask or a contaminant without damaging the underlayer in a mask stripping process.

According to the present invention, a cleaning method for removing metal contamination adhered onto a surface of a substrate with a cleaning solution is provided, wherein the cleaning solution has an oxidation-reduction potential lower than that of pure water and a pH value of 4 or below.

Moreover, according to the present invention, a cleaning method for removing metal contamination adhered onto a surface of a substrate with a cleaning solution is provided, wherein the cleaning solution contains a compound having a carboxyl group and has an oxidation-reduction potential lower than that of pure water.

In the above cleaning method, the surface of the substrate may include an exposed metal face. For example, a surface of a substrate, on which a copper wiring or a copper-aluminum wiring is formed, or a surface of a substrate after a metal pad is formed thereon, can be cleaned.

Furthermore, according to the present invention, a method for cleaning a surface of a semiconductor substrate, on which a metal film is formed, with a cleaning solution after performing chemical mechanical polishing on the semiconductor substrate, is provided, wherein the cleaning solution has an oxidation-reduction potential lower than that of pure water and a pH value of 4 or below.

Furthermore, according to the present invention, a method for cleaning a surface of a semiconductor substrate, on which a metal film is formed, with a cleaning solution after performing chemical mechanical polishing on the semiconductor substrate, is provided, wherein the cleaning solution contains a compound having a carboxyl group and has an oxidation-reduction potential lower than that of pure water.

Moreover, according to the present invention, a method for fabricating a semiconductor device is provided, wherein the method includes the steps of: forming an insulating film on a surface of a semiconductor substrate; after providing a concave portion on a surface of the insulating film, forming a metal film over the entire surface of the substrate so as to bury the concave portion; polishing or etching the metal film so that the metal film remains only in the concave portion; cleaning the surface of the substrate with a treatment solution containing any one of ammonia water, electrolytic cathode water and water containing dissolved hydrogen; and cleaning the surface of the substrate with a cleaning solution having an oxidation-reduction potential lower than that of pure water and a pH value of 4 or below.

Furthermore, according to the present invention, a method for fabricating a semiconductor device is provided, wherein the method includes the steps of: forming an insulating film on a surface of a semiconductor substrate; after providing a concave portion on a surface of the insulating film, forming a metal film over the entire surface of the substrate so as to bury the concave portion; polishing or etching the metal film so that the metal film remains only in the concave portion; cleaning the surface of the substrate with a treatment solution containing any one of ammonia water, electrolytic cathode water and water containing dissolved hydrogen; and cleaning the surface of the substrate with a cleaning solution containing a compound having a carboxyl group and having an oxidation-reduction potential lower than that of pure water.

Moreover, according to the present invention, a method for fabricating a semiconductor device is provided, wherein the method includes the steps of: after depositing a metal film and an insulating film on a semiconductor substrate in this order, providing a mask having an opening on the insulating film; etching the insulating film by using the mask so as to provide a contact hole reaching the metal film; and removing the mask using a stripping solution, the stripping solution having an oxidation-reduction potential lower than that of pure water and a pH value of 4 or below.

Furthermore, according to the present invention, a method for fabricating a semiconductor device is provided, wherein the method includes the steps of: after depositing a metal film and an insulating film on a semiconductor substrate in this order, providing a mask having an opening on the insulating film; etching the insulating film by using the mask so as to provide a contact hole reaching the metal film; and removing the mask using a stripping solution, the stripping solution containing a compound having a carboxyl group and having an oxidation-reduction potential lower than that of pure water.

Furthermore, according to the present invention, a cleaning solution for removing metal contamination adhered onto a surface of a substrate is provided, wherein the cleaning solution has an oxidation-reduction potential lower than that of pure water and a pH value of 4 or below.

Furthermore, according to the present invention, a cleaning solution for removing metal contamination adhered onto a surface of a substrate is provided, wherein the cleaning solution contains a compound having a carboxyl group and has an oxidation-reduction potential lower than that of pure water.

As a cleaning technique in a process for fabricating a semiconductor device, so-called RCA cleaning is widely known. In this cleaning technique, cleaning is conducted with a mixed solution of hydrogen peroxide and acid or a mixed solution of hydrogen peroxide and alkali. However, in the case where such a cleaning technique is applied to cleaning of a substrate having an exposed metal face or a substrate having an exposed face where an element is to be formed, there arise problems in that the metal is dissolved, the exposed face where an element is to be formed is damaged, and the like. For example, in the case where a mixed solution of hydrogen peroxide and acid is used for cleaning of the above-mentioned substrate, the dissolution of a metal by acid is accelerated by hydrogen peroxide. As a result, the damages to the exposed metal face and the like become notable. In the case where the mixed solution of hydrogen peroxide and alkali is used, the damages to the exposed metal face and the like appear in a more conspicuous manner. For the reasons described above, it is necessary to make a technical examination in cleaning of a substrate having an exposed metal face or a substrate having an exposed face where an element is to be formed, from a point of view different from a conventional cleaning technique for a bare wafer, that is, RCA cleaning.

The inventors of the present invention proceed with the examination from a point of view different from conventional cleaning techniques in light of problems specific to cleaning of a substrate having an exposed metal face or a substrate having an exposed face where an element is to be formed, thereby attaining the present invention.

The present invention is for cleaning with a liquid having an oxidation-reduction potential lower than that of pure water and a pH value of 4 or below. With such a liquid, metal contamination adhered onto a surface of an underlayer can be efficiently removed while minimizing the damages to and the dissolution of the surface of the underlayer. With a cleaning process after formation of a metal wiring being taken as an example, the present invention specifically exhibits the following effects.

First, the generation of slits around a metal wiring can be prevented. In conventionally conducted cleaning with an organic acid, a kind of battery effect is generated between a barrier metal film and a burying metal film to promote the dissolution of the metal film, thereby generating slits. On the other hand, since cleaning is conducted with a liquid having a low oxidation-reduction potential in the present invention, the generation of such slits can be prevented. Moreover, since a cleaning solution used in the present invention has a pH value of 4 or below, metal contamination adhered onto a surface of a substrate can be efficiently removed.

Second, the roughness of a surface of a metal wiring can be reduced. A normal organic acid cleaning solution exhibits a low pH value and an oxidation-reduction potential higher than that of pure water. Therefore, a metal constituting the wiring is oxidized. The oxidized metal film is dissolved to be removed by the solvent action of acid. As a result, the surface roughness is increased. Since the present invention employs a cleaning solution having a low oxidation-reduction potential, the oxidation of the wiring material is restrained to suppress the dissolution due to acid.

Third, the removal of metal contamination adhered to a concave portion of a metal constituting a metal wiring or to the periphery of a wiring groove is facilitated. It was conventionally difficult to remove the metal contamination adhered to such portions with a conventional organic acid cleaning solution. The reason for this is as follows. In the case where an organic acid cleaning solution is used, the surface roughness of a metal wiring is increased to form a kind of pits between the metal contamination and the metal wiring. As a result, the metal contamination and the metal wiring are tightly bonded to each other. According to the present invention, a cleaning solution having a low oxidation-reduction potential is used, so that the surface of the metal wiring is maintained in a smooth state. Thus, since such a tight bond is not generated between the metal contamination and the metal wiring, the metal contamination adhered to the above-mentioned portions can be easily removed.

The term "metal" in "metal film" and "exposed metal face" in the present invention includes copper, aluminum, an alloy of copper and aluminum, silver, tungsten and the like. Such a metal is effective particularly in the case where it is used for cleaning a substrate having a copper surface or a copper alloy surface containing copper at 60 percent by mass or higher. The metal contamination in the present invention includes a metal or a metal oxide, that is, copper, aluminum, an alloy of copper and aluminum, silver, tungsten and the like, and the oxides thereof. The effects of the present invention appear in a more notable manner particularly in the case where the present invention is used for cleaning metal contamination including copper, a copper alloy containing copper at 60 percent by mass or higher, or the oxides thereof. Such metal contamination was difficult to remove by conventional acid cleaning or cleaning with water containing dissolved hydrogen. According to the present invention, however, the metal contamination can be effectively removed without damaging an underlayer or the like.

The above-described "copper alloy" includes Cu to which Ag, Sn, Mg, Zr or the like is added. The "metal film" may be a combined film, and includes a film having a structure in which a different kind of metal film such as NiB, COWP or the like is deposited on a copper film.

The form of the metal contamination includes various forms such as a particle-like form and a film-like form.

As described above, the present invention has been mainly described for the case where the present invention is applied to cleaning of a substrate having an exposed metal face. However, it is also effective to apply the present invention to a process strongly requiring the restraint of damages to an underlayer, such as cleaning of the inside of a contact hole to be connected to a transistor. In the case where the present invention is applied to such a process, the metal contamination can be efficiently removed without damaging an underlayer.

Moreover, as described above, according to a method of fabricating a semiconductor device using a stripping solution having an oxidation-reduction potential lower than that of pure water and a pH value of 4 or below, a mask or a contaminant can be removed without damaging an underlayer. In the method of fabricating a semiconductor device, a plurality of kinds of stripping solutions may be used.

DETAILED DESCRIPTION OF THE PREFERRED EMBODIMENT

A pH value of a cleaning solution in the present invention is preferably set to 4 or lower, more preferably, to 3 or lower. By thus setting a pH value, metal contamination can be efficiently removed.

A cleaning solution containing a compound having a carboxyl group can be used as the cleaning solution in the present invention. This compound is: (a) polyvalent carboxylic acid (other than those having an amino group in a molecule) or a salt thereof; (b) polyamino carboxylic acid or a salt thereof; or (c) a mixture of (a) and (b). Since a compound having a carboxyl group is tightly adsorbed to a surface of a metal or a metal oxide, such a compound has the property of removing metal contamination. In particular, the compounds of (a) and (b) described above have a strong chelating function, and thus are capable of effectively removing the metal contamination which is hard to remove.

Figure 5:
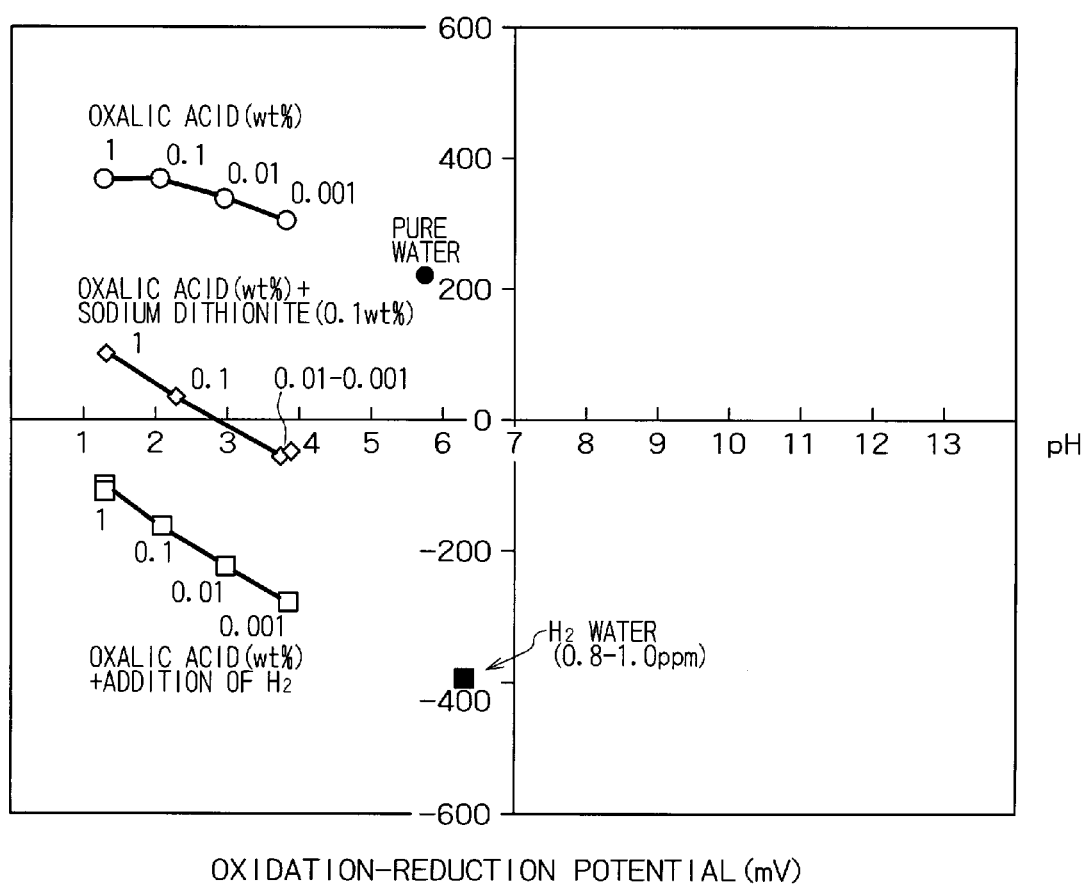
FIG. 5 is a graph showing the relation between cleaning solutions according to the present invention and conventional cleaning solutions.

FIG. 5 is a graph showing an oxidation-reduction potential and a pH value of the cleaning solution according to the present invention. In FIG. 5, the abscissa axis indicates a value of pH of a cleaning solution, and the ordinate axis indicates its oxidation-reduction potential. The oxidation-reduction potential is indicated in mV. In FIG. 5, values indicated adjacent the measured points, for example, 1, 0.1, 0.01 and 0.001 adjacent the measured points of oxalic acid, indicate concentrations of oxalic acid, respectively.

The oxidation-reduction potential is measured in the following manner. Device: a portable electrical conductivity meter (fabricated by DKK-TOA Corporation), Electrode: an ORP electrode, PST-2729C (constituted with a triple-pole; a silver-silver chloride electrode; a platinum electrode; and a thermometer), Measurement method: a prepared solution of 100 ml is placed in a beaker made of PP (PE) having a volume of 100 ml. The tip of the ORP electrode is dipped into the solution to start the measurement. A value obtained when an indicated value becomes stable is read as an ORP of the solution. Measurement temperature: 22 degrees Celsius.

In this case, the oxidation-reduction potential is described as a value obtained by using the silver-silver chloride electrode. In order to convert this value to that obtained by using a normal hydrogen electrode, a correction value at the assumed temperature (normally, +200 mV) may be added to the obtained value.

Oxalic acid, which is used for cleaning the contamination of a metal film, has the oxidation-reduction potential in the range of 200 mV or higher. The cleaning solution according to the present invention can be obtained by adding a reducing agent to oxalic acid or dissolving hydrogen in oxalic acid. In this manner, the oxidation-reduction potential of oxalic acid, which is present in the range of 200 mV or over, is shifted to the region of the oxidation-reduction potential lower than that of pure water. The oxidation-reduction potential of oxalic acid is lowered to be lower than that of pure water so as to reduce the damages to the metal film. Accordingly, the generation of slits in a metal wiring, or the increase in roughness of the metal surface can be prevented.

The cleaning solution according to the present invention has a pH value lower than that of pure water. Preferably, a pH value of the cleaning solution is 4 or lower. With such a pH value, the metal contamination can be effectively removed. It is important that the oxidation-reduction potential is lower than that of pure water. In the case where the cleaning solution is used in a copper wiring formation process or the like, it is preferred to set the oxidation-reduction potential at 0 mV or lower (with respect to the silver-silver chloride electrode). In this manner, the damages to a metal film containing copper can be prevented, thereby effectively preventing the generation of slits or the generation of roughness on the surface. In the case where oxidation-reduction potential is lowered by adding a reducing agent or hydrogen to an organic acid, it is important whether the cleaning performance of acid is changed by this addition or not. According to the examination of the inventors of the present invention, no drop in cleaning performance is observed. Therefore, it is confirmed that the cleaning performance inherent to that organic acid is maintained.

Figure 6:
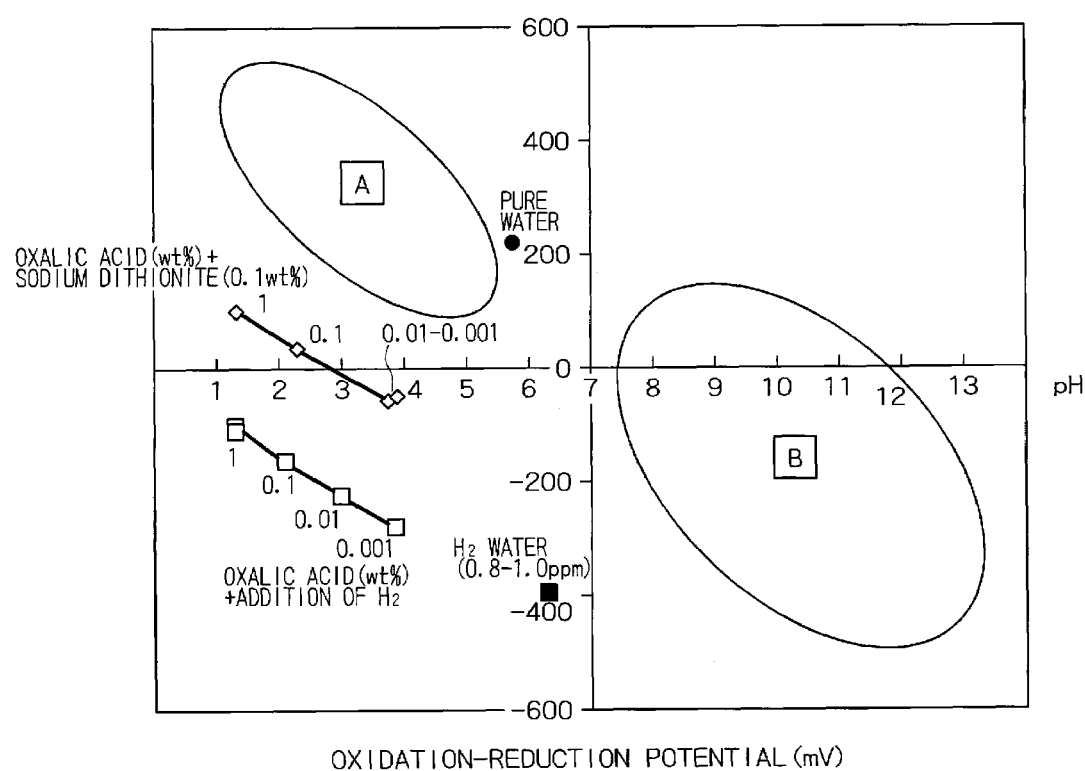
FIG. 6 is a graph showing the relation between cleaning solutions according to the present invention and conventional cleaning solutions.

FIG. 6 shows the relation between cleaning solutions according to the present invention and conventional cleaning solutions. The cleaning solution according to the present invention has a pH value and an oxidation-reduction potential lower than those of pure water, and therefore is situated in a lower left region in FIG. 6. On the other hand, conventional chemical solutions using acid (SPM (sulfuric acid-hydrogen peroxide solution) or HPM (hydrochloric acid-hydrogen peroxide solution)), electrolytic anode water and ozone water are situated in an upper left region (region A) in FIG. 6. APM (ammonia-hydrogen peroxide solution), a conventional alkaline chemical solution and electrolytic cathode water are situated in a right region (region B) in FIG. 6.

In the present invention, a pH value of the cleaning solution is 4 or less, more preferably, 3 or less. With such a pH value, the metal contamination can be effectively removed. With a cleaning solution having a pH value in a neutral region, i.e., in the vicinity of 7, it is difficult to sufficiently remove the metal contamination.

In the present invention, the oxidation-reduction potential of the cleaning solution is lower than that of pure water. Preferably, the oxidation-reduction potential is set to +100 mV or lower, more preferably, 0 mV or lower. In this manner, the damages to a metal film can be effectively prevented.

Chemical solutions falling within the range of the cleaning solution of the present invention have not been conventionally used in a semiconductor process because an effective method of using these chemical solutions has not been found. Owing to the examination of the inventors of the present invention, it is found that: (i) the cleaning performance inherent to acid is not lowered even when a reducing agent or hydrogen is added to acid; and (ii) the effects of preventing the damages to a metal film or an underlayer are remarkably improved by using an acid solution having a reducing ability, which findings lead to the present invention.

The cleaning solution according to the present invention can be obtained by bubbling hydrogen in an aqueous acid solution so as to dissolve hydrogen therein. Alternatively, the cleaning solution can also be obtained by adding a reducing agent to an aqueous solution of acid. Besides these methods, a cleaning solution can be obtained by dissolving hydrogen in a solution by the following methods.

(a) An aqueous acid solution is passed through a hydrogen dissolving module so as to dissolve hydrogen therein;
(b) Pure water is passed through a hydrogen dissolving module so as to dissolve hydrogen therein, followed by addition of acid.
(c) Water, which is obtained from a cathode by electrolyzing acid, is utilized; and
(d) Acid is added to cathode water obtained from a cathode by electrolysis.

As a reducing agent, hyposulfurous acid or sulfate reducing agent is preferably used. For example, sodium thiosulfate, sodium dithionite, sodium pyrosulfite, sodium metabisulfite and the like are used. Moreover, amine reducing agents such as hydroxylamine, tryptophan, histidine, methionine and phenylalanine can also be used.

The cleaning solution of the present invention preferably contains carboxyl acid or its salt. A surface of metal contamination adhered onto a surface of a substrate is normally covered with a metal oxide. A carboxyl group included in carboxyl acid is adsorbed onto the metal oxide so as to induce the chelating function. As a result, the adhered metal contamination can be effectively removed. Carboxyl acid preferably has two or more carboxyl groups in a molecule. In this manner, the chelating function of carboxyl acid is increased, thereby improving the cleaning performance. More specifically, it is preferred that carboxyl acid include at least one selected from the group consisting of oxalic acid, citric acid, malic acid, maleic acid, succinic acid, tartaric acid and malonic acid.

The present invention is applicable in a process for removing the metal contamination while restraining the damages to an underlayer. More specifically, the present invention is suitably applicable to the following processes.

(a) A process of forming a copper wiring (Damascene process);
(b) A process of cleaning inside a contact hole to be connected to a transistor after formation of the contact hole; and
(c) Cleaning of a ferroelectric film in a fabrication process of a ferroelectric memory.

In the case where the present invention is applied to the process (a), the damages to a copper wiring and the generation of slits can be effectively prevented. In the case where the present invention is applied to the process (b), the reliability of a transistor can be improved.

In the case where the present invention is applied to the process (c), a ferroelectric film can be processed into a desired shape without varying a composition of the ferroelectric film. In particular, in the case where a perovskite material is selected as a film material, a component, which is easily solvable in a conventional cleaning solution, is dissolved in the cleaning solution, varying a film composition in some cases. However, the application of the present invention is effective because the occurrence of variation in a film composition can be effectively prevented. It is preferred that a film made of BST ($BaSrTiO_x$), PZT ($PbZrTiO_x$), PLZT ($PbLaZrTiO_x$), STO ($SrTiO_x$) and $SrBiTaO_x$ can be given (for any of the above-mentioned compounds, 0<x) as specific examples of the perovskite material. Moreover, a material such as $Ta_2O_5$ can be used. In the case where one of the above-described materials is selected, the effects of the present invention can be demonstrated in more notable manner. More specifically, in the case where the above-mentioned materials are conventionally used for a capacitor element, a large storage capacitance is obtained, whereas a problem arises in that an etching residue is difficult to remove while restraining the reduction in thickness and the deterioration in characteristics of a ferroelectric film. According to a method of the present invention, however, such a problem is solved. Therefore, the excellent characteristics of the above-mentioned materials can be fully exhibited. A method of forming the above-mentioned ferroelectric film is not particularly limited. In the case of a PZT film, for example, the PZT film can be formed by a known method such as a sol-gel method, a sputtering method or a CVD method.

Next, embodiments where the present invention is applied to a method of fabricating a semiconductor device will be described.

First, a first embodiment relates to a Cu wiring formation process where the present invention is applied to cleaning process after Cu-CMP. In a CMP process, a solution, which is obtained by adding silica particles or alumina particles to a solution containing an oxidizing agent, for example, hydrogen peroxide solution or iron nitrate, is frequently used. In such a case, alumina particles or the like remain on the surface of a wafer after CMP. Cu scraped by CMP is oxidized with hydrogen peroxide solution to be CuOx, which is then adhered onto the surface of the wafer to be metal contamination. It is required to clean away these particles and metal contamination without damaging the Cu wiring.

The remaining alumina particles derived from a polisher adhered onto the wafer can be removed by brush cleaning. On the other hand, the other metal contamination as is represented by Cu can be uniquely removed by a chemical method. Furthermore, a Cu wiring portion must not be damaged in removal of the metal contamination. Thus, it is desirable to conduct these removal processes in different cleaning processes, respectively. Therefore, in this embodiment, the cleaning method includes a first step of removing particles such as alumina and a second step of removing metal contamination with a cleaning solution containing carboxylic acid and the like so as to effectively remove the metal contamination and the like without damaging a Cu wiring portion.

After Cu-CMP, copper contamination remaining on the surface is present in the form of copper oxide. The reducing ability of the oxidizing agent according to the present invention is not so strong to convert copper oxide into copper. Therefore, the copper contamination present in the form of copper oxide is sufficiently removed owing to chelating function of the cleaning solution. On the other hand, side slits generated at a boundary between a copper wiring and a barrier metal film can be effectively prevented from being generated by using the cleaning solution according to the present invention. The side slits are generated because copper in a wiring portion is converted into copper oxide which is then dissolved by acid or the like. However, since the above-mentioned cleaning solution has the reducing ability, such dissolution does not proceed. As a result, the generation of slits is restrained. Hereinafter, a process of removing the metal contamination is described with reference to the drawings.

Figure 9A:
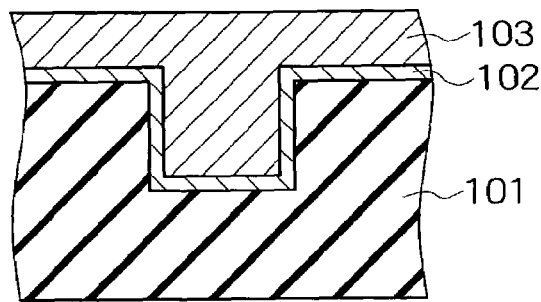
FIGS. 9A to 9D are cross-sectional views showing the respective steps for illustrating a cleaning method according to the present invention.

FIGS. 9A to 9D are cross-sectional views showing the respective steps of a cleaning process after formation of a copper wiring. First, as shown in FIG. 9A, a copper film is formed on a surface of a substrate. More specifically, a barrier metal film 102 and a copper film 103 are formed over the entire surface of the substrate so as to bury a wiring groove formed on an insulating film 101. The barrier metal film 102 is formed by, for example, sputtering or the like. As a material of the barrier metal film 102, TiN, Ta, TaN, TaSiN, W, WN or the like can be used. The metal film 103 is formed by a plating method, a sputtering method, a CVD method or the like. FIG. 9A shows a state where these films are formed.

Figure 9B:
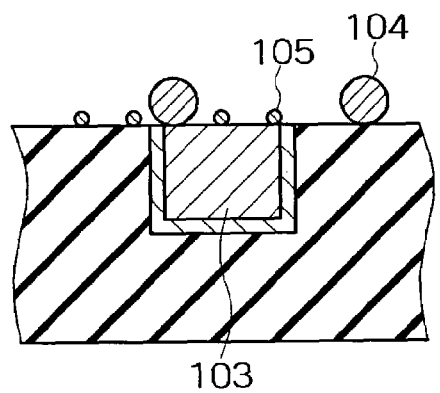

Subsequently, as shown in FIG. 9B, a surface of the copper film 103 is polished by CMP so as to remove the barrier metal film 102 and the copper film 103 present in a region other than in the wiring groove. As a result, a copper wiring patterned into a predetermined shape is formed.

At this moment, as shown in FIG. 9B, particles 104 and metal contamination 105 are generated due to a CMP slurry and scraps generated by polishing the copper film 103, which are then adhered onto the surface of the substrate.

Figure 9C:
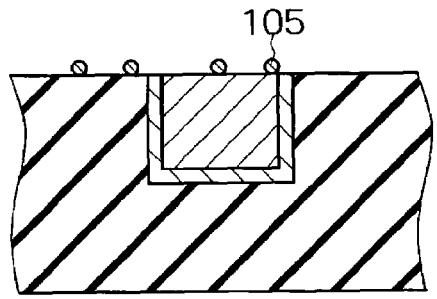

Then, as shown in FIG. 9C, brush scrub cleaning using an alkaline cleaning solution (hereinafter, this brush scrub cleaning is referred to as a first step) is first conducted to remove the particles 104. As an alkaline cleaning solution, ammonia water having a low concentration or the like is used. As a result of the first step, the particles 104 are removed to obtain a state as shown in FIG. 9C.

Figure 9D:
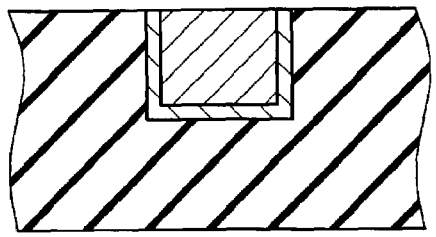

Subsequently, as shown in FIG. 9D, cleaning with acid for removing the metal contamination 105 (hereinafter, this cleaning is referred to as a second step) is conducted. In the present invention, a cleaning solution having an oxidation-reduction potential lower than that of pure water and a pH value of 4 or lower is used as a cleaning solution in the second step. With such a cleaning solution, it is possible to efficiently remove the metal contamination 105 without damaging the surface of the copper film 103 while preventing the slits from being generated between the copper film 103 and the barrier metal film 102. After the above-mentioned processes, rinsing is conducted so as to remove the remaining cleaning solution or the like. Although the rinsing is normally conducted with pure water, the use of reduced water with addition of an extremely small amount of ammonia (pH 7.5 to 9.5) instead of pure water is preferred because such reduced water can prevent a charge-up phenomenon of the substrate from occurring.

The first and second steps in the above-described process will be respectively described below in further detail.

First, the removal of particles in the first step will be described. In the first step, in order to restrain the re-adhesion of desorbed particles, it is preferred that a wafer and particles have potentials of the same sign (i.e., plus or minus) so that the wafer and the particles electrically repel each other. From this point of view, a first cleaning solution containing ammonia water or the like is used in the first step. By using such a cleaning solution, the surface potential of the wafer and that of the particles are set to have the same sign, so that the wafer and the particles electrically repel each other to restrain the re-adhesion of the particles.

Ammonia water is preferably used as the first cleaning solution because ammonia water rarely induces the contamination on the surface of a semiconductor material. Herein, it is more preferred to set a concentration of ammonia water within the range of 0.0001 to 0.5 percent by mass, more preferably, 0.0005 to 0.01 percent by mass because Cu can easily form a complex with ammonia water having a high concentration to be dissolved. The sufficient cleaning performance is not obtained at a too low concentration, whereas a Cu surface is roughened to cause the deterioration in performance of a semiconductor device at a too high concentration. In the case where a metal material is W, a concentration of ammonia water can be increased to the range of 0.0001 to 5 percent by mass.

As the first cleaning solution, electrolytic cathode water can also be used instead of ammonia water. The electrolytic cathode water is a liquid generated on a cathode side when pure water or water containing a small amount of ammonium ions (0.5 percent by mass or lower) is electrolyzed. As a generator for obtaining electrolytic cathode water, for example, a device employing a double-cell electrolytic method (see Denki-Kagaku Binran (in Japanese), the fourth edition, issued in 1985, page 277, and the like) can be used. Besides this double-cell device, a triple-cell device can also be used. In the case where pure water is to be electrolyzed, a special device obtained by improving the above-mentioned device is used. Raw water of electrolytic cathode water, that is, pure water or water containing a small amount of ammonium ions (0.5 percent by mass or lower) is fed to each of the electrolytic cells where a DC voltage is applied to electrolyze the raw water. Although the electrolytic cathode water obtained from the cathode side is neutral to alkalescent, the electrolytic cathode water does not etch the Cu film for its high reducing ability owing to active hydrogen generated on the cathode. Moreover, like ammonia water having a high concentration, the electrolytic cathode water allows the surface potential of the wafer and that of the particles to be set to the negative potential so as to restrain re-adhesion of the particles.

Besides the above-described ammonia water and electrolytic cathode water, a solution containing dissolved hydrogen can be used as the first cleaning solution. The solution containing dissolved hydrogen is an aqueous solution obtained by dissolving hydrogen in pure water or water containing a small amount of ammonium ions (at 0.5 percent by mass or lower). As a method of dissolving hydrogen, bubbling and the like is employed.

In the case where the electrolytic cathode water or the solution containing dissolved hydrogen is used as the first cleaning solution, its oxidation-reduction potential is preferably set to −1000 to −300 mV, more preferably, to −800 to −600 mV when using a silver chloride electrode as a reference electrode. A concentration of ammonia contained in the electrolytic cathode water or the solution containing dissolved hydrogen is preferably 0.0005 to 0.01 percent by mass, and the amount of dissolved hydrogen is preferably 0.1 to 10 ppm.

Next, cleaning in the second step will be described. The second step employs a cleaning solution satisfying either of the following conditions (a) and (b).

(a) a cleaning solution having an oxidation-reduction potential lower than that of pure water and a pH value of 4 or lower; and (b) a cleaning solution containing a compound having a carboxyl group, for example, carboxylic acid, and having an oxidation-reduction potential lower than that of pure water.

Although spin cleaning is preferred as a cleaning method, mechanical cleaning with the use of a brush may also be employed.

As means for realizing an oxidation-reduction potential lower than that of pure water, a method of dissolving hydrogen in a cleaning solution, a method of adding a reducing agent such as sodium dithionite to a cleaning solution, or the like can be used.

As carboxylic acid, for example, oxalic acid can be used. Oxalic acid has the ability of efficiently forming a chelate complex with the Cu metal contamination (CuOx) generated in Cu-CMP. On the other hand, since the Cu film is unlikely to form a complex with oxalic acid due to its metallic bond, the Cu film is not etched. Moreover, since TiN, Ta, TaN or the like used as a material of the barrier metal film 102 does not form a complex with oxalic acid, these materials are not etched either. Therefore, it is possible to selectively remove the Cu metal contamination remaining on the surface of the substrate without etching and deteriorating the Cu wiring and the barrier film.

In the case where Ta or TiN is used as a material of the barrier metal film 102 whereas Cu is used as a material of a burying conductive film as in this embodiment, dishing frequently occurs in the copper wiring due to a difference in CMP polishing speed between a material for the barrier metal film such as Ta or TiN, and Cu. The Cu metal contamination adhered to a portion where dishing occurs is generally hard to remove. In the case where the cleaning performance of a cleaning solution is intended to be further improved in view of problems such as dishing, means for adding polyamino carboxylic acid to a cleaning solution is effective. Polyamino carboxylic acid is apt to tightly form a complex with the metal contamination remaining on the surface after CMP, and therefore is excellent in the ability of removing the metal contamination.

As polyamino carboxylic acids, compounds such as ethylenediaminetetraacetic acid (EDTA), trans-1,2-cyclohexanediaminetetraacetic acid (CyDTA), nitrilotriacetic acid (NTA), diethylenetriamine pentaacetic acid (DTPA) and N-(2-hydroxyethyl) ethylenediamine-N, N',N'-triacetic acid (EDTA-OH) or the salts thereof are preferred. For fabrication of a semiconductor device, a salt which does not adversely affects the characteristics of the semiconductor device is preferred; in particular, a salt which does not contain any metal such as ammonium salt is preferred. The content of polyamino carboxylic acid is preferably 1 to 10000 ppm, more preferably, 10 to 1000 ppm with respect to the cleaning solution for a substrate. At a too low concentration of polyamino carboxylic acid, sufficient chelation is not obtained. On the contrary, at a too high concentration, an organic material remains on the surface of a substrate to degrade the performance of a semiconductor element. Moreover, the disposal of liquid wastes is costly.

The first and second steps have been described above. This embodiment realizes effective cleaning with the combination of these two steps. Although the adherence of metal contamination onto a copper surface becomes tight so as to be hard to desorb after implementation of the first cleaning, even such metal contamination can be easily removed by using the cleaning method of this embodiment.

Next, the present invention will be described for a second embodiment of a method for fabricating a semiconductor device.

Figure 8A:
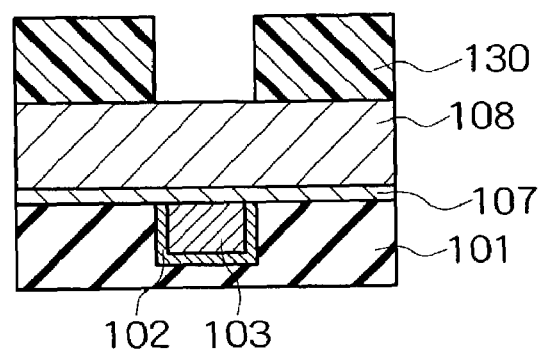
FIGS. 8A to 8D are cross-sectional views showing the respective steps for illustrating a cleaning method according to the present invention.

The second embodiment is an example where the present invention is applied to cleaning for the inside of a through hole after formation of the through hole. Hereinafter, the second embodiment is described with reference to FIGS. 8A to 8D. First, as shown in FIG. 8A, a copper wiring formed of the insulating film 101, the barrier metal film 102 and the copper film 103 is formed by a Damascene process. Next, after deposition of the diffusion barrier film 107 and the interlayer insulating film 108, a resist 130 having an opening is formed. This state is shown in FIG. 8A. In this embodiment, a silicon nitride film is used as the diffusion barrier film 107, and a silicon oxide film is used as the interlayer insulating film 108. Besides these films, a SiC film, a SiCN film or the like can be used as the diffusion barrier film 107, and a low dielectric film can be used as the interlayer insulating film 108. In particular, the use of a low dielectric film as the interlayer insulating film 108 is advantageous in view of increase in operation speed of an element or the like. As a material of the low dielectric film, HSQ (hydrogen silsesquioxane), MHSQ having a structure obtained by methylating HSQ, MSQ, organic materials such as SiLK and FLARE, or SIOC materials can be used. Furthermore, a film having a porous structure using these materials can also be used. As a material of the resist 130, in addition to resist materials for KrF and resist materials for ArF, resist materials for electron beam exposure can be used.

Figure 8B:
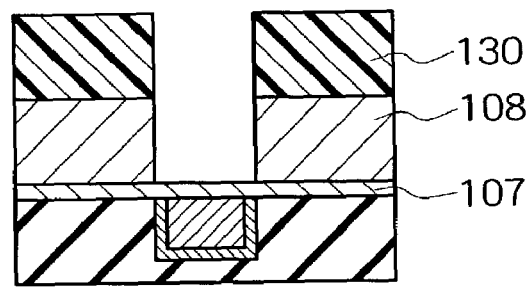

Next, as shown in FIG. 8B, the interlayer insulating film 108 is etched by dry etching, using the resist 130 as a mask. As an etching gas, a gas having a high selection ratio with respect to the diffusion barrier film 107 and the interlayer insulating film 108 is used so as to block the etching at the diffusion barrier film 107. FIG. 8B shows a state after etching.

Figure 8C:
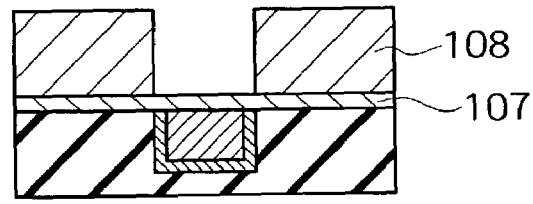

Subsequently, as shown in FIG. 8C, the resist 130 is removed by a treatment with a stripping solution and oxygen plasma ashing. Then, the inside of a through hole is cleaned.

Figure 8D:
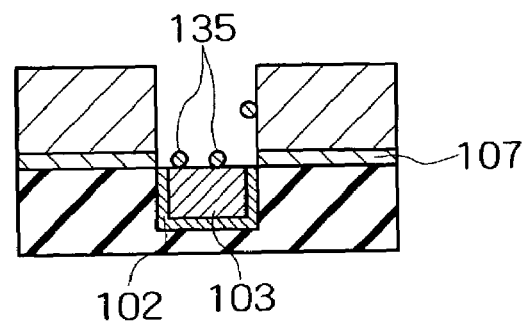

Thereafter, as shown in FIG. 8D, a gas different from the etching gas used in FIG. 8B is used so as to conduct the second dry etching to remove the diffusion barrier film 107. At this moment, impurities 135 including metal contamination or etching residues are adhered on the inside of the through hole.

Figure 1:
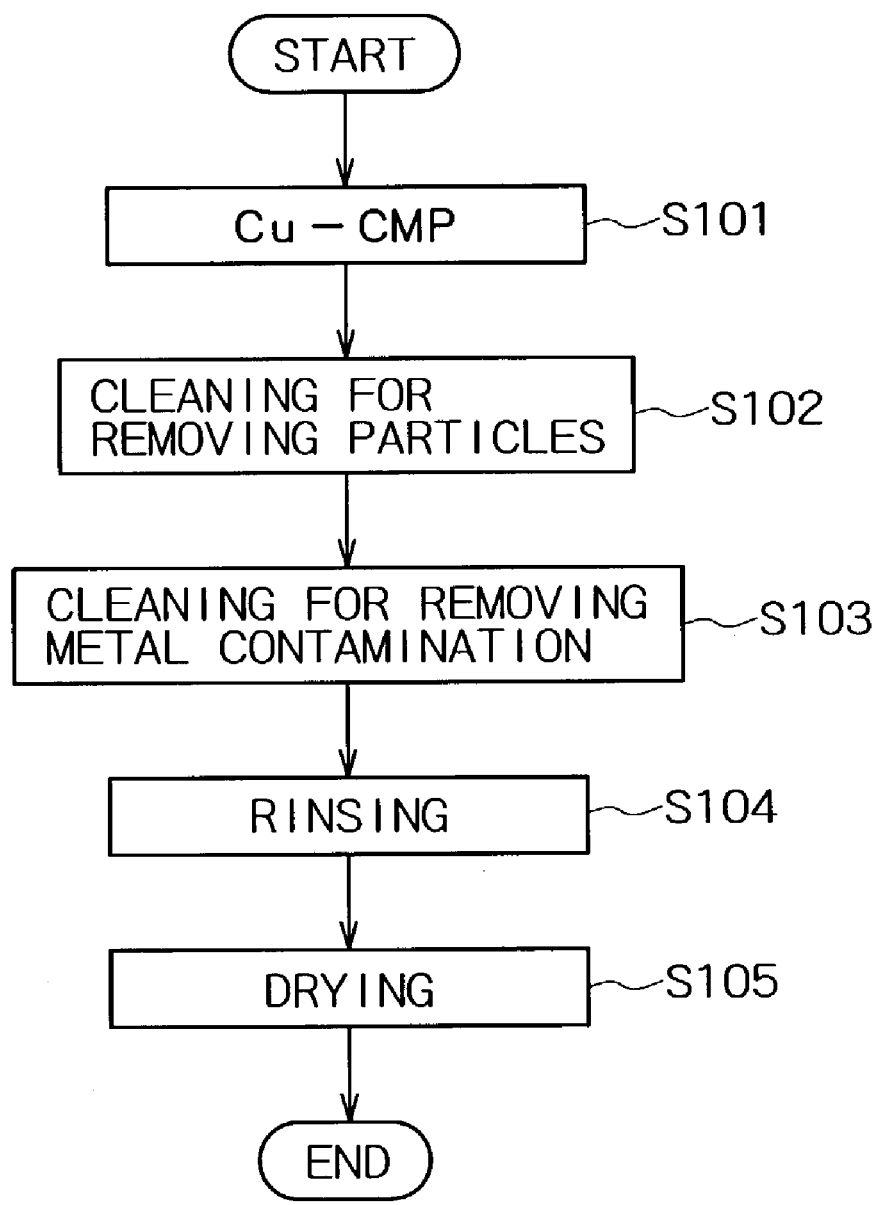
FIG. 1 is a diagram for illustrating a cleaning process after Cu-CMP.
Figure 2A:
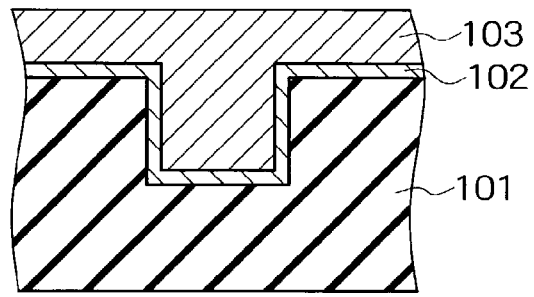
FIGS. 2A to 2D are cross-sectional views for illustrating the cleaning process after Cu-CMP.
Figure 2B:
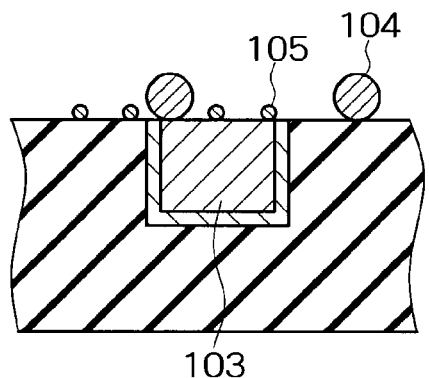
Figure 2C:
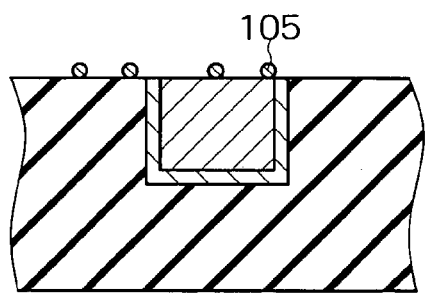
Figure 2D:
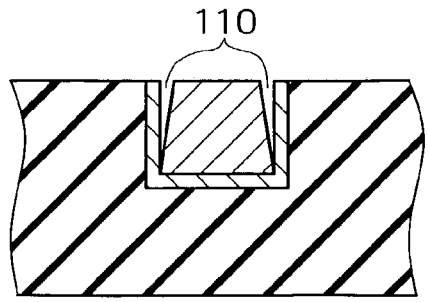
Figure 3:
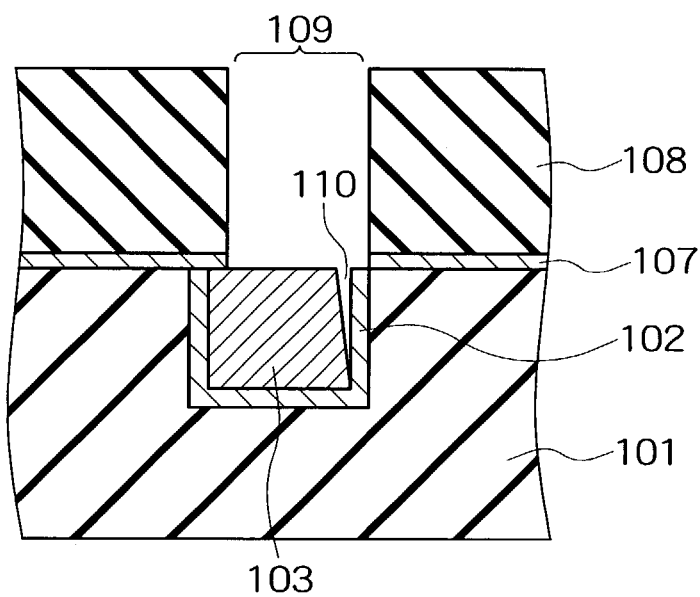
FIG. 3 is a view showing a state after through hole etching.

Thereafter, the impurities 135 are removed, followed by cleaning of the inside of the hole. The impurities 135 include etching residues, reactants of the etching gas, metal contamination and the like. Although an amine cleaning solution, an ammonium fluoride cleaning solution or the like has been conventionally used for cleaning at this stage, an oxalic acid solution in which hydrogen is dissolved is used in this embodiment. A concentration of oxalic acid is set to 0.005 to 0.5 percent by mass, and a concentration of a hydrogen gas is set to 1 ppm to 2.5 ppm in this embodiment. As a result, a solution having a pH value of 2 to 4 and an oxidation-reduction potential of −200 mV to −400 mV can be generated. Ethylenediaminetetraacetic acid (EDTA) may be optionally added to the obtained cleaning solution. In the case where a conventional cleaning solution is used, slits are generated between the barrier metal film 102 and the copper film 103 (FIG. 3), and the roughness on the surface of the copper film 103 is increased to increase a contact resistance, resulting in poor film formation in some cases. Moreover, the metal contamination adhered on the boundary face between the barrier metal film 102 and the copper film 103 is not sufficiently removed in some cases. According to the process employed in this embodiment, such problems are solved. Accordingly, the inside of the through hole can be thoroughly cleaned while preventing the damages to the copper wiring.

Next, a third embodiment where the present invention is applied to a method of fabricating a semiconductor device will be described. In the third embodiment, the present invention is applied to a cleaning process after formation of a contact hole which is to be connected to a transistor. As a cleaning solution, for example, an oxalic acid solution in which hydrogen is dissolved is used. A concentration of oxalic acid is set to 0.005 to 0.5 percent by mass, and a concentration of a hydrogen gas is 1 ppm to 2.5 ppm. As a result, a solution having a pH value of 2 to 4 and an oxidation-reduction potential of −200 mV to −400 mV can be generated. Ethylenediaminetetraacetic acid (EDTA) may be optionally added to the obtained cleaning solution.

Figure 4:
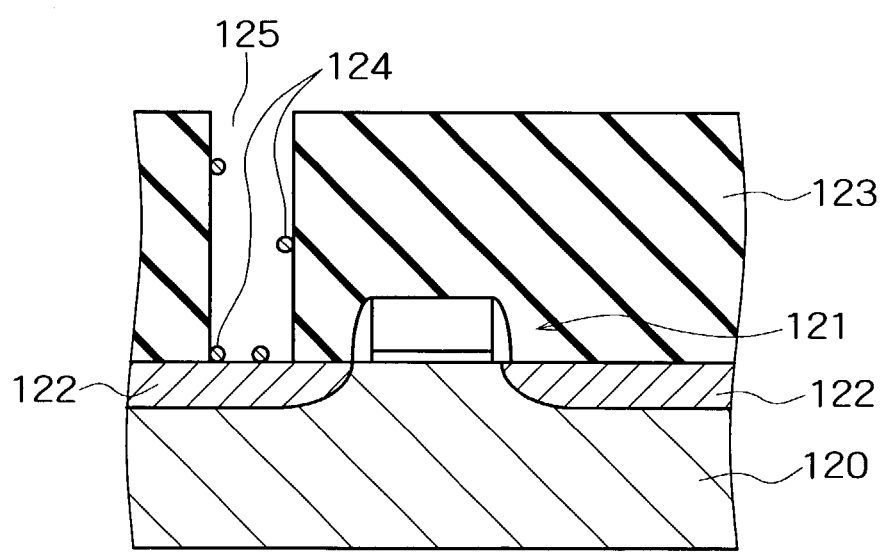
FIG. 4 is a view showing a state after contact hole etching.

FIG. 4 shows a state immediately after formation of the contact hole 125. In FIG. 4, the field effect transistor 121 is formed on the surface of the silicon substrate 120. The source/drain regions 122 are provided on both sides of the field effect transistor 121. The contact hole 125 formed through the interlayer insulating film 123 reaches the surface of the source/drain regions 122. The metal contamination 124 generated in the etching step is adhered onto the inner wall and the bottom face of the contact hole 125. Conventionally, cleaning with a mixed solution of hydrogen peroxide and hydrochloric acid is conducted to remove the metal contamination 124. In the case where a conventional cleaning solution is used, however, the surfaces of the source/drain regions 122 are damaged, resulting in lowered reliability of an element. Since an acid cleaning solution having a lower oxidation-reduction potential than that of pure water is used in this embodiment, the metal contamination 124 can be efficiently removed while restraining the damages to the source/drain regions 122.

Next, a fourth embodiment where the present invention is applied to a method of fabricating a semiconductor device will be described. In the process shown in FIGS. 8A to 8D, the cleaning solution according to the present invention can also be used as a stripping solution to remove the resist 130 in the steps shown in FIGS. 8B to 8C. For example, the same stripping solution as that used in the second embodiment can be used as a stripping solution in this embodiment. A stripping treatment may be implemented in a single step using the above-mentioned stripping solution. Alternatively, a treatment using an amine stripping solution or hydrofluoric acid stripping solution may be implemented prior to the treatment using the above-mentioned stripping solution. In view of efficiency of the process, hydrogen plasma ashing or oxygen plasma ashing is desirably conducted prior to the treatment using a stripping solution.

Next, the result of actual cleaning using the cleaning solution according to the present invention is described for illustrating the effects of the present invention.

EXAMPLE 1

The process described with reference to FIGS. 9A to 9D was actually implemented so as to measure the cleaning performance of cleaning solutions. As cleaning solutions, the following four cleaning solutions were prepared to confirm the cleaning performance of each of the cleaning solutions.

Cleaning solution 1: an aqueous solution of oxalic acid at 0.1 percent by mass;
Cleaning solution 2: an aqueous solution of oxalic acid at 0.1 percent by mass in which 1 ppm of a hydrogen gas is dissolved;
Cleaning solution 3: an aqueous solution containing oxalic acid at 0.1 percent by mass and EDTA at 0.1 percent by mass in which 1 ppm of a hydrogen gas is dissolved; and
Cleaning solution 4: an aqueous solution of HCl at pH 5.

An oxidation-reduction potential of the cleaning solution 1 was about 380 mV, and that of the cleaning solution 2 was about −200 mV. The cleaning solution 1 had a pH value of about 2.0, and the cleaning solution 2 had a pH value of about 2.2. The oxidation-reduction potential was measured under the following conditions. Device: a portable electrical conductivity meter (fabricated by DKK-TOA Corporation), Electrode: an ORP electrode, PST-2729C (constituted with a triple-pole; a silver-silver chloride electrode; a platinum electrode; and a thermometer), Measurement method: a prepared solution of 100 ml was placed in a beaker made of PP (PE) having a volume of 100 ml. The tip of the ORP electrode was dipped into the solution to start the measurement. A value obtained when an indicated value became stable was read as an oxidation-reduction potential of the solution. Measurement temperature: 22 degrees Celsius.

After the measurement of a concentration of copper contamination remaining on the surface of the substrate, the following copper concentrations on the surface of the substrate were obtained.

Before cleaning: $5 \times 10^{12}$ atoms/cm$^2$;
After cleaning with the cleaning solution 1: $2 \times 10^{10}$ atoms/cm$^2$ or below;
After cleaning with the cleaning solution 2: $2 \times 10^{10}$ atoms/cm$^2$ or below;
After cleaning with the cleaning solution 3: $2 \times 10^{10}$ atoms/cm$^2$ or below; and
After cleaning with the cleaning solution 4: $3 \times 10^{12}$ atoms/cm$^2$.

The cleaning performances of the cleaning solutions 1, 2 and 3 were almost equal to each other. Any drop in the cleaning performance due to dissolution of hydrogen was not observed. The cleaning with the cleaning solution 4 could not sufficiently remove the copper contamination.

EXAMPLE 2

After formation of the copper film on the silicon substrate, a cleaning treatment was conducted with predetermined cleaning solutions. Thereafter, the roughness on the surface of the copper film was measured.

As cleaning solutions, the following three cleaning solutions were used.

(a) oxalic acid (0.03 percent by mass);
(b) oxalic acid (0.03 percent by mass)+hydrogen (1 ppm); and
(c) oxalic acid (0.03 percent by mass)+a reducing agent (0.1 percent by mass).

where the reducing agent is sodium dithionite.

Figure 7:
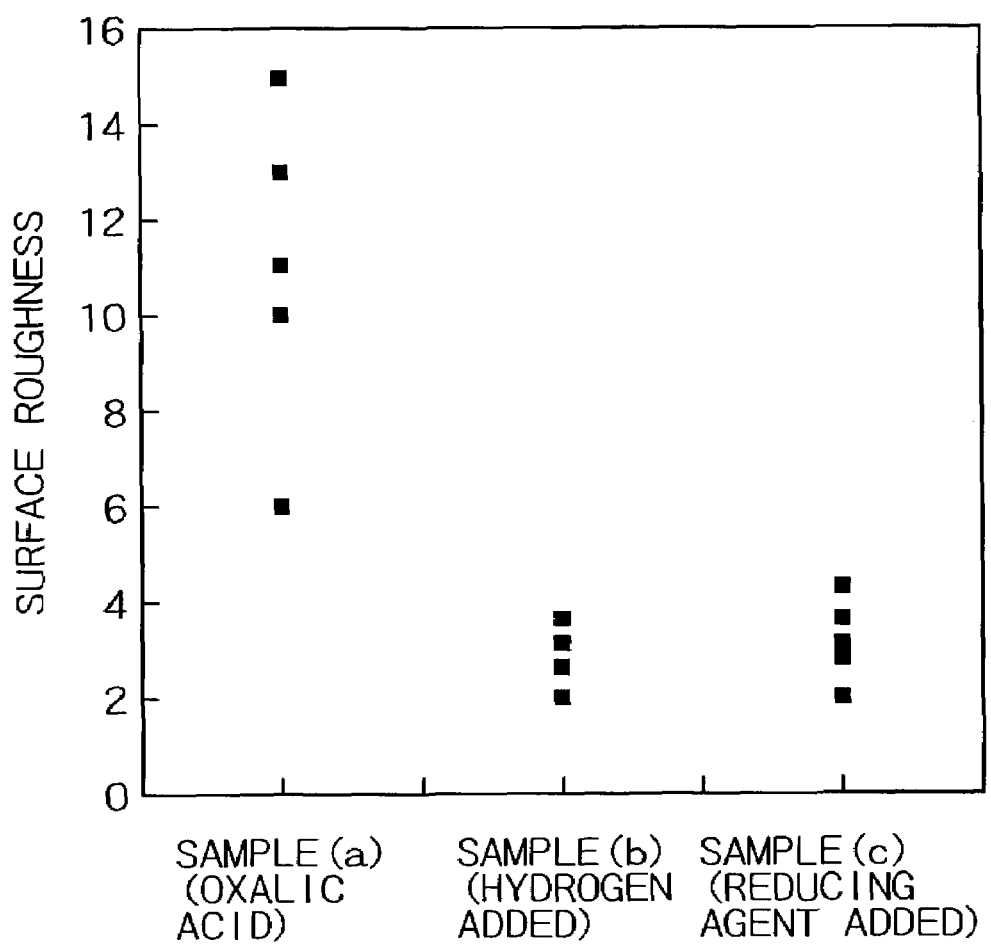
FIG. 7 is a view showing the result of measurement of surface roughness in an embodiment of the present invention.

The oxidation-reduction potential of the cleaning solution (a) was about 380 mV, the oxidation-reduction potential of the cleaning solution (b) was about −200 mV, and the oxidation-reduction potential of the cleaning solution (c) was about 50 mV. The measurement of the oxidation-reduction potential was implemented under the same conditions as those in Example 1. The cleaning solution (a) had a pH value of about 2.5, the cleaning solution (b) had a pH value of about 3.0, and the cleaning solution (c) had a pH value of about 2.6. The measurement was conducted for each of the cleaning solutions where N=5. The result is shown in FIG. 7. In FIG. 7, the ordinate axis indicates a relative value of roughness of the copper film surface. The surface roughness of the copper film was large in a conventional cleaning method with the cleaning solution (a), whereas the surface roughness of the copper film was remarkably reduced in the case where the cleaning solutions (b) and (c) according to the present invention were used.

As described above, according to the present invention, since cleaning is conducted using a cleaning solution having an oxidation-reduction potential lower than that of pure water and a pH value of 4 or lower, metal contamination adhered onto a surface of a substrate can be efficiently removed without damaging an underlayer. Moreover, since a mask is stripped by using a cleaning solution having an oxidation-reduction potential lower than that of pure water and a pH value of 4 or lower, the mask or contaminants can be removed without damaging the underlayer.

What is claimed is:

1. A method for fabricating a semiconductor device, comprising the steps of:
    forming an insulating film on a surface of a semiconductor substrate;
    providing a concave portion on a surface of the insulating film;
    forming a metal film over the entire surface of the substrate so as to bury the concave portion;
    polishing or etching the metal film so that the metal film remains only in the concave portion;
    cleaning the surface of the substrate with a treatment solution containing any one of ammonia water, electrolytic cathode water and water containing dissolved hydrogen; and
    cleaning the surface of the substrate with a cleaning solution having an oxidation-reduction potential lower than that of pure water and a pH value of 4 or below.

2. The method for fabricating a semiconductor device according to claim 1, wherein the cleaning solution is a solution containing a dissolved hydrogen gas.

3. The method for fabricating a semiconductor device according to claim 1, wherein the cleaning solution contains a reducing agent.

4. The method for fabricating a semiconductor device according to claim 1, wherein the metal film contains copper.

5. The method for fabricating a semiconductor device according to claim 1, further comprising the step of:
    forming a barrier metal film on a surface of the concave portion, before forming said metal film.

6. The method for fabricating a semiconductor device according to claim 5, wherein the barrier metal is Ta or TaN.

7. A method for fabricating a semiconductor device, comprising the steps of:
    forming an insulating film on a surface of a semiconductor substrate;
    providing a concave portion on a surface of the insulating film;
    forming a metal film over the entire surface of the substrate so as to bury the concave portion;
    polishing or etching the metal film so that the metal film remains only in the concave portion;
    cleaning the surface of the substrate with a treatment solution containing any one of ammonia water, electrolytic cathode water and water containing dissolved hydrogen; and
    cleaning the surface of the substrate with a cleaning solution containing a compound having a carboxyl group and having an oxidation-reduction potential lower than that of pure water.

8. The method for fabricating a semiconductor device according to claim 7, wherein the cleaning solution contains one of polyvalent carboxylic acid (other than those having an amino group in a molecule) and its salt.

9. The method for fabricating a semiconductor device according to claim 8, wherein the polyvalent carboxylic acid contains at least one selected from the group consisting of oxalic acid, citric acid, malic acid, maleic acid, succinic acid, tartaric acid and malonic acid.

10. The method for fabricating a semiconductor device according to claim 7, wherein the cleaning solution further contains one of polyamino carboxylic acid and its salt.

11. The method for fabricating a semiconductor device according to claim 7, wherein the cleaning solution is a solution containing a dissolved hydrogen gas.

12. The method for fabricating a semiconductor device according to claim 7, wherein the cleaning solution contains a reducing agent.

13. The method for fabricating a semiconductor device according to claim 12, wherein the reducing agent is selected from the group consisting of hyposulfurous acid, a sulfate reducing agent and an amine reducing agent.

14. The method for fabricating a semiconductor device according to claim 13, wherein the sulfate reducing agent is selected from the group consisting of sodium thiosulfate, sodium dithionite, sodium pyrosulfite, and sodium metabisulfite.

15. The method for fabricating a semiconductor device according to claim 13, wherein the amine reducing agent is selected from the group consisting of hydroxylamine, tryptophan, histidine, methionine and phenylalanine.

16. The method for fabricating a semiconductor device according to claim 7, wherein the metal film contains copper.

17. The method for fabricating a semiconductor device according to claim 7, further comprising the step of:
    forming a barrier metal film on a surface of the concave portion, before forming said metal film.

18. The method for fabricating a semiconductor device according to claim 17, wherein the barrier metal is Ta or TaN.

19. A method for fabricating a semiconductor device, comprising the steps of:
    depositing a metal film and an insulating film on a semiconductor substrate in this order;
    providing a mask having an opening, on the insulating film;
    etching the insulating film by using the mask so as to provide a contact hole reaching the metal film; and
    removing the mask using a stripping solution containing a compound having a carboxyl group and having an oxidation-reduction potential lower than that of pure water,
    wherein the stripping solution further contains one of polyamino carboxylic acid and its salt.

20. The method for fabricating a semiconductor device according to claim 19, wherein the metal film contains copper.

21. A method for fabricating a semiconductor device, comprising the steps of:
    depositing a metal film and an insulating film on a semiconductor substrate in this order;
    providing a mask having an opening, on the insulating film;
    etching the insulating film by using the mask so as to provide a contact hole reaching the metal film; and
    removing the mask using a stripping solution having an oxidation-reduction potential lower than that of pure water and a pH value of 4 or below,
    wherein the stripping solution is a solution containing a dissolved hydrogen gas.

22. The method for fabricating a semiconductor device according to claim 21, wherein the metal film contains copper.

23. A method for fabricating a semiconductor device, comprising the steps of:
    depositing a metal film and an insulating film on a semiconductor substrate in this order;

providing a mask having an opening, on the insulating film;

etching the insulating film by using the mask so as to provide a contact hole reaching the metal film; and removing the mask using a stripping solution containing a compound having a carboxyl group and having an oxidation-reduction potential lower than that of pure water, wherein the stripping solution is a solution containing a dissolved hydrogen gas.

24. The method for fabricating a semiconductor device according to claim 23, wherein the metal film contains copper.

* * * * *